United States Patent
Rapoport

(10) Patent No.: US 9,562,956 B2
(45) Date of Patent: Feb. 7, 2017

(54) ROTATABLE PROTECTIVE COVER FUNCTIONING AS A DOOR FOR MRI SYSTEM

(71) Applicant: Aspect Imaging Ltd., Shoham (IL)

(72) Inventor: Uri Rapoport, Moshav Ben Shemen (IL)

(73) Assignee: Aspect Imaging Ltd., Shoham (IL)

( * ) Notice: Subject to any disclaimer, the term of this patent is extended or adjusted under 35 U.S.C. 154(b) by 752 days.

(21) Appl. No.: 13/903,057

(22) Filed: May 28, 2013

(65) Prior Publication Data
US 2014/0117989 A1    May 1, 2014

Related U.S. Application Data

(60) Provisional application No. 61/720,440, filed on Oct. 31, 2012.

(51) Int. Cl.
G01R 33/422 (2006.01)
G01R 33/28 (2006.01)

(52) U.S. Cl.
CPC ........... *G01R 33/288* (2013.01); *G01R 33/422* (2013.01)

(58) Field of Classification Search
USPC .......... 324/300–322; 600/407–435; 174/384
See application file for complete search history.

(56) References Cited

U.S. PATENT DOCUMENTS

| | | | |
|---|---|---|---|
| 4,613,820 A * | 9/1986 | Edelstein | G01D 11/24 324/300 |
| 4,651,099 A * | 3/1987 | Vinegar | G01R 33/28 174/384 |
| 7,071,692 B2 * | 7/2006 | Branch | G01R 33/422 324/318 |
| 7,274,192 B2 * | 9/2007 | Havens | G01R 33/3806 324/318 |
| 7,486,982 B2 * | 2/2009 | Branch | G01R 33/422 324/318 |
| 8,807,084 B2 | 8/2014 | Rapoport et al. | |
| 8,851,018 B2 | 10/2014 | Rapoport et al. | |
| 8,896,310 B2 | 11/2014 | Rapoport | |
| 2003/0088175 A1 * | 5/2003 | Branch | G01R 33/422 600/410 |
| 2004/0194989 A1 * | 10/2004 | Branch | G01R 33/422 174/363 |
| 2004/0196043 A1 * | 10/2004 | Branch | G01R 33/422 324/318 |
| 2005/0027189 A1 * | 2/2005 | Branch | G01R 33/422 600/410 |

(Continued)

OTHER PUBLICATIONS

Rapoport, Uri, "RF Shielding Conduit in an MRI Closure Assembly", co-pending U.S. Appl. No. 14/574,785, filed Dec. 18, 2014.

(Continued)

*Primary Examiner* — Melissa Koval
*Assistant Examiner* — Tiffany Fetzner
(74) *Attorney, Agent, or Firm* — Pearl Cohen Zedek Latzer Baratz LLP

(57) ABSTRACT

A rotatable protective cover functioning as a door, that both opens and closes off, an entrance opening of a patient bore in an MRI device is disclosed. The rotatable protective cover comprises a semi-permeable barrier material, MRI shielding, and physical shielding; and is at least partially transparent.

12 Claims, 4 Drawing Sheets

(56) References Cited

U.S. PATENT DOCUMENTS

| | | | |
|---|---|---|---|
| 2006/0267585 A1* | 11/2006 | Havens | G01R 33/3806 324/318 |
| 2007/0135704 A1* | 6/2007 | Branch | G01R 33/422 600/410 |
| 2011/0162652 A1 | 7/2011 | Rapoport | |
| 2011/0186049 A1 | 8/2011 | Rapoport | |
| 2011/0234347 A1 | 9/2011 | Rapoport | |
| 2011/0304333 A1 | 12/2011 | Rapoport | |
| 2012/0071745 A1 | 3/2012 | Rapoport | |
| 2012/0073511 A1 | 3/2012 | Rapoport et al. | |
| 2012/0077707 A1 | 3/2012 | Rapoport | |
| 2012/0119742 A1 | 5/2012 | Rapoport | |
| 2013/0079624 A1 | 3/2013 | Rapoport | |
| 2013/0109956 A1 | 5/2013 | Rapoport | |
| 2013/0237803 A1 | 9/2013 | Rapoport | |
| 2013/0328559 A1 | 12/2013 | Rapoport | |
| 2013/0328560 A1 | 12/2013 | Rapoport | |
| 2013/0328563 A1 | 12/2013 | Rapoport | |
| 2014/0050827 A1 | 2/2014 | Rapoport | |
| 2014/0051973 A1 | 2/2014 | Rapoport et al. | |
| 2014/0051974 A1 | 2/2014 | Rapoport et al. | |
| 2014/0051976 A1 | 2/2014 | Rapoport et al. | |
| 2014/0099010 A1 | 4/2014 | Rapoport et al. | |
| 2014/0103927 A1 | 4/2014 | Rapoport | |
| 2014/0117989 A1* | 5/2014 | Rapoport | G01R 33/422 324/322 |
| 2014/0128725 A1 | 5/2014 | Rapoport et al. | |
| 2014/0139216 A1 | 5/2014 | Rapoport | |
| 2014/0142914 A1 | 5/2014 | Rapoport | |
| 2014/0152302 A1 | 6/2014 | Rapoport et al. | |
| 2014/0152310 A1 | 6/2014 | Rapoport | |
| 2014/0158062 A1 | 6/2014 | Rapoport et al. | |
| 2014/0230850 A1 | 8/2014 | Rapoport | |
| 2014/0257081 A1 | 9/2014 | Rapoport | |
| 2014/0266203 A1 | 9/2014 | Rapoport et al. | |
| 2014/0300358 A1 | 10/2014 | Rapoport | |
| 2014/0378821 A1 | 12/2014 | Rapoport et al. | |
| 2014/0378825 A1 | 12/2014 | Rapoport et al. | |
| 2015/0059655 A1 | 3/2015 | Rapoport | |
| 2015/0065788 A1 | 3/2015 | Rapoport | |
| 2015/0137812 A1* | 5/2015 | Rapoport | G01R 33/288 324/318 |
| 2015/0141799 A1* | 5/2015 | Rapoport | A61B 5/0555 600/410 |

OTHER PUBLICATIONS

Aspect Imaging Ltd., "System and Method for Generating Invasively Hyperpolarized Images", co-pending U.S. Appl. No. 14/556,682, filed Dec. 1, 2014.
Aspect Imaging Ltd., "System and Method for Generating Invasively Hyperpolarized Images", co-pending U.S. Appl. No. 14/556,654, filed Dec. 1, 2014.
Aspect Imaging Ltd., "MRI with Magnet Assembly Adapted for Convenient Scanning of Laboratory Animals with Automated RF Tuning Unit", co-pending U.S. Appl. No. 14/581,266, filed Dec. 23, 2014.
Aspect Imaging Ltd., "Foamed Patient Transport Incubator", co-pending U.S. Appl. No. 14/531,289, filed Nov. 3, 2014.
Aspect Imaging Ltd., "Mechanical Clutch for MRI", co-pending U.S. Appl. No. 14/611,379, filed Feb. 2, 2015.
Aspect Imaging Ltd., "Incubator Deployable Multi-Functional Panel", co-pending U.S. Appl. No. 14/619,557, filed Feb. 11, 2015.
Aspect Imaging Ltd., "MRI Thermo-Isolating Jacket", co-pending U.S. Appl. No. 14/623,039, filed Feb. 16, 2015.
Aspect Imaging Ltd., "MRI RF Shielding Jacket", co-pending U.S. Appl. No. 14/623,051, filed Feb. 16, 2015.
Aspect Imaging Ltd., "Capsule for a Pneumatic Sample Feedway", co-pending U.S. Appl. No. 14/626,391, filed Feb. 19, 2015.
Aspect Imaging Ltd., "Incubator's Canopy with Sensor Dependent Variably Transparent Walls and Methods for Dimming Lights Thereof", co-pending U.S. Appl. No. 14/453,909, filed Aug. 7, 2014.
Aspect Imaging Ltd., "Temperature-Controlled Exchangeable NMR Probe Cassette and Methods Thereof", co-pending U.S. Appl. No. 14/504,890, filed Oct. 2, 2014.
Aspect Imaging Ltd., "NMR Extractable Probe Cassette Means and Methods Thereof", co-pending U.S. Appl. No. 14/504,907, filed Oct. 2, 2014.
Aspect Imaging Ltd., "Means for Operating an MRI Device Within a RF-Magnetic Environment", co-pending U.S. Appl. No. 14/596,320, filed Jan. 14, 2015.
Aspect Imaging Ltd., "Means and Method for Operating an MRI Device Within a RF-Magnetic Environment", co-pending U.S. Appl. No. 14/596,329, filed Jan. 14, 2015.
Aspect Imaging Ltd., "CT/MRI Integrated System for the Diagnosis of Acute Strokes and Methods Thereof", co-pending U.S. Appl. No. 14/598,517, filed Jan. 16, 2015.
Aspect Imaging Ltd., "RF Automated Tuning System Used in a Magnetic Resonance Device and Methods Thereof", co-pending U.S. Appl. No. 14/588,741, filed Jan. 2, 2015.
Aspect Imaging Ltd., "A Method for Providing High Resolution, High Contrast Fused MRI Images", co-pending U.S. Appl. No. 13/877,553, filed Apr. 3, 2013.
Aspect Imaging Ltd., "A Method for Manipulating the MRI's Protocol of Pulse-Sequences", co-pending U.S. Appl. No. 14/070,695, filed Nov. 4, 2013.
Aspect Imaging Ltd, "MRI—Incubator's Closure Assembly", co-pending U.S. Appl. No. 14/539,442, filed Nov. 12, 2014.
Aspect Imaging Ltd., "Shutting Assembly for Closing an Entrance of an MRI Device", co-pending U.S. Appl. No. 14/540,163, filed Nov. 13, 2014.
Aspect Imaging Ltd., "Cage in an MRD with a Fastening/Attenuating System", co-pending U.S. Appl. No. 14/527,950, filed Oct. 30, 2014.

* cited by examiner

300
Close configuration

ROTATABLE PROTECTIVE COVER FUNCTIONING AS A DOOR FOR MRI SYSTEM

CROSS-REFERENCE TO RELATED APPLICATIONS

This application claims priority from U.S. Provisional Patent Application No. 61/720,440, filed on Oct. 31, 2012, which is hereby incorporated by reference.

FIELD OF THE INVENTION

The present invention generally relates to the field of magnetic resonance imaging systems (MRI), and more particularly, to a rotatable protective shielding cover that functions as a door, which both opens and closes off, a patient bore entrance opening of an MRI system during an imaging procedure with the MRI system.

BACKGROUND OF THE INVENTION

The use of magnetic resonance imaging (MRI) as a diagnostic tool is a fairly recent innovation in the medical field.

In MRI scanning, the MRI apparatus operates as a large magnet wherein the protons align with the strong magnetic field but are easily disturbed by a brief radio frequency pulse of very low energy so as to alter their alignment. As the protons return to their orientation with the magnetic field, they release energy of a radio frequency that is strongly influenced by the biochemical environment. The released energy is detected and mathematically analyzed for display as a two dimensional proton density image according to the signal intensity of each tissue.

The potential dangers associated with MRI scanners include a strong magnetic field within the apparatus and surrounding area. The magnetic force may convert loose iron, steel and other metal objects into unguided missiles directed at the MRI apparatus and striking personnel within the vicinity of an MRI apparatus, when these objects have been unwittingly introduced into the magnetic field of the MRI system. It is well known in the art that MRI devices are usually located within a shielded room for improved results and also to lessen the impact of the device on surrounding operations. However, the problem persists of metal objects being negligently introduced into the magnetic field by personnel entering the room or the extended magnetic field of the MRI apparatus.

It therefore remains a long felt and unmet need to provide an apparatus having an MRI shield for MRI devices in order to prevent the introduction of iron, steel and other metal objects into the magnetic field of an MRI apparatus.

SUMMARY OF THE INVENTION

There is provided in accordance with a preferred embodiment of the present invention a rotatable protective cover for an MRI that functions as a door, which both opens and closes off, a patient bore entrance opening, the rotatable protective cover characterized in that:

(a) it comprises a semi-permeable barrier material, MRI shielding, and physical shielding, and (b) it is at least partially transparent.

There is further provided in accordance with a preferred embodiment of the present invention the rotatable protective cover as defined above, wherein the semi-permeable barrier is made at least partially of connected strands of flexible or ductile material.

There is further provided in accordance with a preferred embodiment of the present invention the rotatable protective cover as defined above, wherein the flexible or ductile material comprises a material selected from the group consisting of metal and fiber.

There is further provided in accordance with a preferred embodiment of the present invention the rotatable protective cover as defined above, wherein the semi-permeable barrier is constructed of material selected from the group consisting of copper, paramagnetic materials, ferromagnetic materials, and any combination thereof.

There is further provided in accordance with a preferred embodiment of the present invention the rotatable protective cover as defined above, wherein the semi-permeable barrier has a structure of a mesh, a web or a net.

There is further provided in accordance with a preferred embodiment of the present invention the rotatable protective cover as defined above, wherein the rotatable protective cover is transparent.

There is further provided in accordance with a preferred embodiment of the present invention the rotatable protective cover as defined above, wherein the MRI shielding is an RF shielding type.

There is further provided in accordance with a preferred embodiment of the present invention the rotatable protective cover as defined above, wherein the rotatable protective cover is configured such that when the cover is in place, patient bore entrance opening of the MRI is completely covered by the rotatable protective cover.

There is further provided in accordance with a preferred embodiment of the present invention the rotatable protective cover as defined above, wherein the rotatable protective cover comprises an attaching means with a matching corresponding attaching means on the MRI, thereby the rotatable protective cover functions as a door for opening and closing the MRI.

There is further provided in accordance with a preferred embodiment of the present invention the rotatable protective cover as defined above, wherein the attaching means are configured such that upon opening, the rotatable protective cover remains attached to the MRI.

There is further provided in accordance with a preferred embodiment of the present invention the rotatable protective cover as defined above, wherein the rotatable protective cover has a shape selected from the group consisting of: tubular, cone shaped, cup shaped, cylindrical, sleeve like, and hollow with a perimeter configured to match a patient bore entrance of the MRI and an internal shape configured to match an object placed within.

There is further provided in accordance with a preferred embodiment of the present invention the rotatable protective cover as defined above, wherein the rotatable protective cover has a shape which can be mated to an incubator that is placed within the MRI.

There is further provided in accordance with a preferred embodiment of the present invention the rotatable protective cover as defined above, wherein the rotatable protective cover further comprises a ring frame disposed about the perimeter of the rotatable protective cover.

There is further provided in accordance with a preferred embodiment of the present invention the rotatable protective cover as defined above, wherein the magnetic shielding extends over an area at least equal to an open area of the patient bore entrance.

BRIEF DESCRIPTION

In order to understand the invention and to see how it may be implemented in practice, a few preferred embodiments will now be described, by way of non-limiting example only, with reference to be accompanying drawings, in which.

DETAILED DESCRIPTION OF THE PREFERRED EMBODIMENTS

The following description is provided so as to enable any person skilled in the art to make use of the invention and sets forth the best modes contemplated by the inventor of carrying out this invention. Various modifications, however, will remain apparent to those skilled in the art, since the generic principles of the present invention have been defined specifically to provide an apparatus for covering MRI opening.

The term 'magnetic resonance device' (MRD), 'magnetic resonance imaging (MRI,) or 'magnetic resonance system', specifically applies hereinafter to any Magnetic Resonance Imaging (MRI) device, any Nuclear Magnetic Resonance (NMR) spectroscope, any Electron Spin Resonance (ESR) spectroscope, any Nuclear Quadruple Resonance (NQR) or any combination thereof. The term, in this invention, also applies to any other analyzing and imaging instruments comprising a volume of interest, such as computerized tomography (CT), ultrasound (US) etc. The MRD hereby disclosed is optionally a portable MRI device, such as the ASPECT-MR Ltd commercially available devices, or a commercially available non-portable device. Moreover, the term 'MRD' interchangeably refers in general to any non-incubator medical devices, at least temporary accommodating the neonate.

As used herein, the term 'incubator' may include isolation like devices which are self-contained incubator units that provides a controlled heat, humidity, and oxygen microenvironment for the isolation and care of premature and low-birth weight neonates. The apparatus is often made of a clear plastic material and has a large door and portholes for easy access to the infant with a minimum of heat and oxygen loss. A servo control mechanism constantly monitors the infant's temperature and controls the heat within the unit. The incubator may further be mounted on a movable cart or the like.

The MRI (magnetic resonance imaging) system having an opening can have a diameter to accommodate a patient, in which the patient is inserted in order to lie within a large cylindrical magnet.

Figure 1:
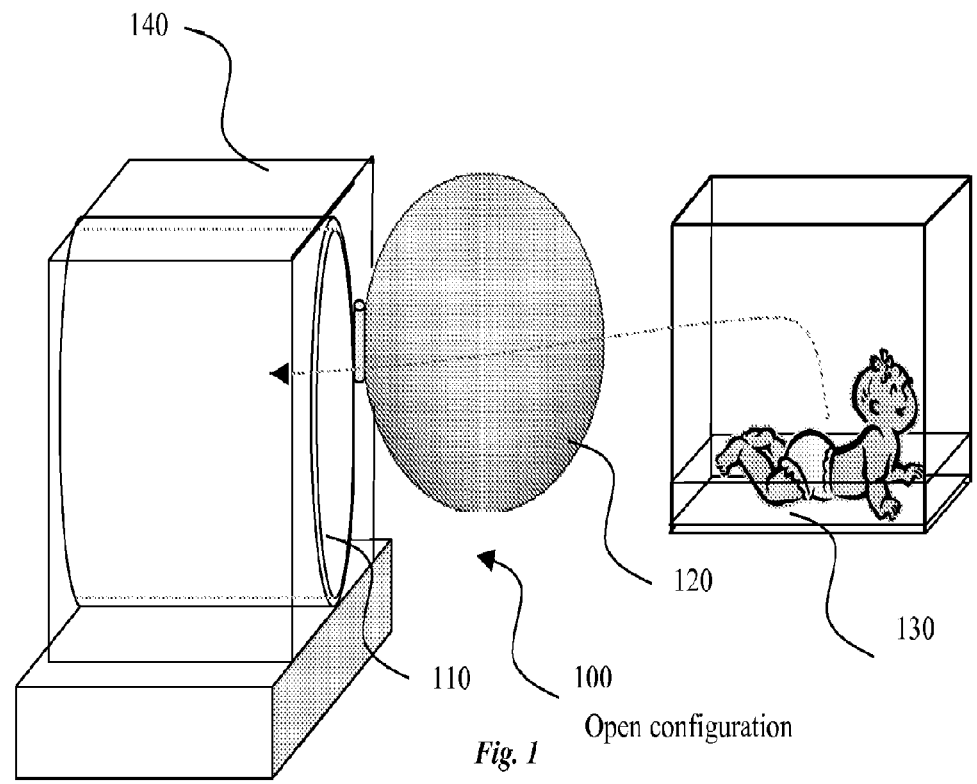
FIG. 1 illustrates a rotatable protective cover of an MRI having an opening in its open configuration, in accordance with a preferred embodiment of the present invention.

FIG. 1 presents an illustration of a rotatable protective cover 120 for an MRI 140 having an opening 110. The rotatable protective cover is characterized in that: (a) it comprises a semi-permeable barrier, MRI shielding, and physical shielding, and (b) it is at least partially transparent.

Reference is now made to FIG. 1 which presents an open configuration 100 of the rotatable protective cover. The rotatable protective cover may be opened in a vertical direction or in a horizontal direction to an upper position or a lower position of the MRI.

The rotatable protective cover is located upon the front opening of the MRI. The rotatable protective cover may comprise attaching means matching corresponding attaching means on the MRI, thereby functioning as a door for opening and closing the MRI. Furthermore the attaching means are configured such that upon opening, the rotatable protective cover remains attached to the MRI.

The rotatable protective cover may further be hingably mounted, to at least on one side thereof, to a portion of the MRI, corresponding to one side of the opening by a hinge mechanism. The rotatable protective cover may further be extracted from the MRI.

In another embodiment of the present invention, the rotatable protective cover is configured such that when the rotatable protective cover is in place, an opening of the MRI is completely covered by the cover and further protects from undesirable magnetic field leakage.

The rotatable protective cover has a shape selected from the group consisting of: tubular, cone shaped, cup shaped, cylindrical, sleeve like, and hollow with a perimeter configured to match a bore of the MRI and an internal shape configured to match an object placed within.

In another embodiment of the present invention, a handle (not shown) may further be provided at the outer side portion of the rotatable protective cover. In accordance with this structure, the cover is hingably movable when the user pulls the handle to open the opening or pushes the handle to close the MRI patient entrance opening.

In another embodiment of the present invention, the rotatable protective cover may be partially made of a transparent material or transparent texture which may function as a window door. The window door may be made of a transparent glass material to provide highest-visibility RF view window of a subject. The rotatable protective cover may be partially made of glass whilst imbedded with copper. Furthermore, the rotatable protective cover may be fully made of a glass platform. Since the glass provides a full sealing and provides a constant temperature a ventilation system may be further adapted.

In another embodiment of the present invention, the rotatable protective cover may be partially made of semi-permeable barrier which is made of connected strands of metal, fiber, or other flexible or ductile material. The semi-permeable barrier has a structure of a mesh, a web or net which has many attached or woven strands. The semi-permeable barrier is further selected from the group consisting of: copper, paramagnetic materials which have a relative magnetic permeability greater or equal to unity attracted to magnetic fields, ferromagnetic materials or combination thereof. In order to create a strong magnetic shield the cover may be formed partially from paramagnetic materials. Paramagnetic materials exhibit, at least over an appreciable temperature range, magnetic susceptibilities that adhere to the Curie or Curie-Weiss laws. Furthermore the paramagnet material have the advantage that they do not retain any magnetization in the absence of an externally applied magnetic field, resulting from thermal motion randomizes the spin orientations. The rotatable protective cover may be formed partially from ferromagnetic metal or their alloys, such as Co, Fe, $Fe_2O_3$, $FeOFe_2O_3$, $NiOFe_2O_3$, $CuOFe_2O_3$, $MgOFe_2O_3$, MnBi, MnSb, Ni, $MnOFe_2O_3$, $Y_3Fe_5O_{12}$, $CrO_2$, MnAs, Gd, Dy, or EuO. The rotatable protective cover may further be of a combination of copper, ferromagnetic metals and paramagnetic metals.

In another embodiment of the present invention, the rotatable protective cover is characterized by a magnetic shielding to protect the environment from the MRI magnetic field. The magnetic shielding is an RF shielding which can be made of virtually types of metals. The most prominent types used for MRI shielding are copper, galvanized steel, and aluminum. Other metals are not typically used due to drawbacks such as ease of handling or modifications, and corrosion.

The copper RF shield may be a copper sheeting wrapped around and bolted together to form a cover. This type of shielding is lightweight, easily modified to address field or site discrepancies, and provides a lasting RF enclosure. Another type of RF shield system may be a pan-form shield constructed entirely of metal. This system is bolted together to form the cover. This system can utilize galvanized steel, stainless steel, or aluminum, depending upon the preference of the MRI system manufacturer. The cover further provides a magnetic field shield and may further prevent a projectile effect of ferromagnetic objects.

Figure 2:
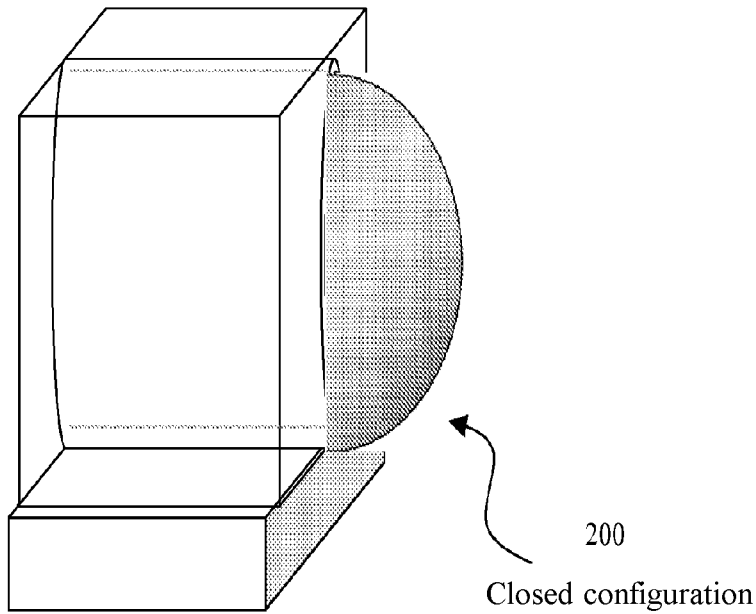
FIG. 2 illustrates a rotatable protective cover of an MRI having a patient bore in its close configuration when no imaging occurs, in accordance with a preferred embodiment of the present invention.
Figure 3:
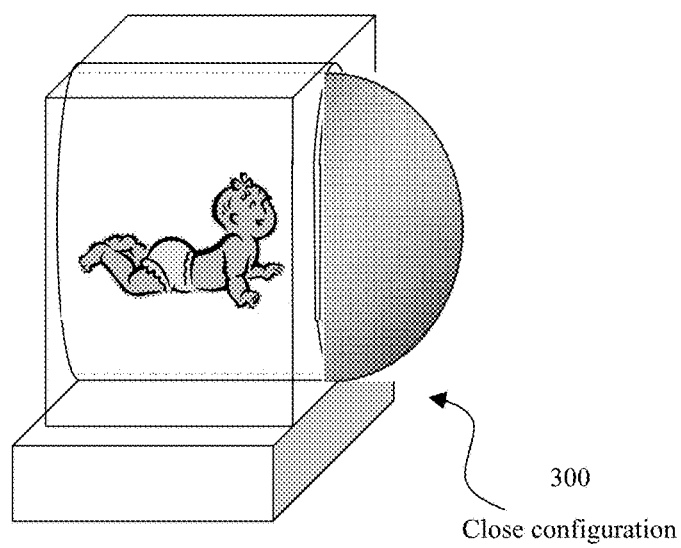
FIG. 3 illustrates a rotatable protective cover of an MRI having an opening in its close configuration in an imaging procedure, in accordance with a preferred embodiment of the present invention.

The rotatable protective cover seals the bore 110 of the MRI device 140 in a manner of a Faraday shield adequately. The rotatable protective cover mesh overlaps significantly and is in contact with the MRI device Reference is now made to FIGS. 2 and 3 which present a close configuration of the rotatable protective cover of an MRI. FIG. 2 presents a close configuration when no imaging procedure is performed 200 on the other hand, FIG. 3 presents a close configuration when an imaging procedure is occurring 300. The rotatable protective cover can be closed in a vertical direction or horizontal direction to an upper position or a lower position of the MRI.

In another embodiment of the present invention, the cover may further comprises a ring frame disposed about the perimeter of the cover. The frame may have a structure of an annular rim for surrounding the cover and further providing better sealing in a latch manner to maintain the cover fully opened or closed. The rotatable protective cover is coupled to the MRI in a manner which prevents exiting of a magnetic field from the imaging system. Therefore the magnetic shielding extends over an area at least equal to an open area of the bore.

Figure 4:
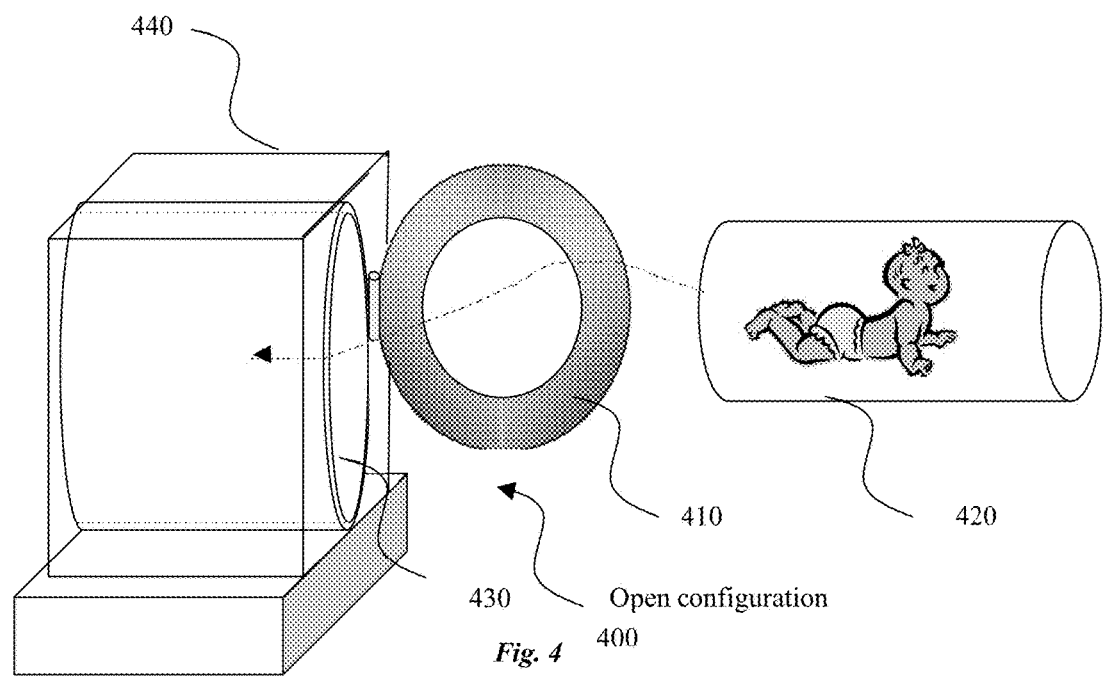
FIG. 4 illustrates a rotatable protective cover of an MRI having an opening comprising an incubator in its open configuration, in accordance with a preferred embodiment of the present invention.

Reference is now made to FIG. 4 which presents a rotatable protective cover 410 of a bore opening 430 of a MRI 440 having a length. The bore opening 430 can be a patient entrance comprising an incubator with a subject 420 such a child, baby or infant, in its open configuration 400. The rotatable protective cover has a shape which can be mated to an incubator within the MRI. The cover is characterized in that: (a) it comprises a semi-permeable barrier, MRI shielding, and physical shielding, and (b) it is at least partially transparent.

The rotatable protective cover is located in the front of the MRI patient entrance bore opening. The rotatable protective cover may further be hingably mounted, to at least one side thereof, to a portion of the MRI opening tunnel, corresponding to one side of the opening by a hinge configuration.

Figure 5:
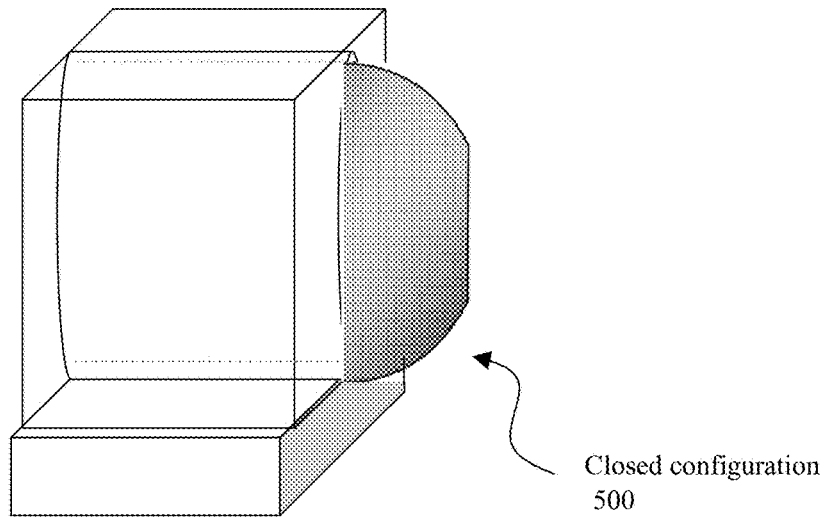
FIG. 5 illustrates rotatable protective cover of an MRI having an opening comprising an incubator in its close configuration when no imaging occurs, in accordance with a preferred embodiment of the present invention.

Reference is now made to FIG. 5 which presents a rotatable protective cover of a MRI in its close configuration 500, not including an incubator with a subject.

Figure 6:
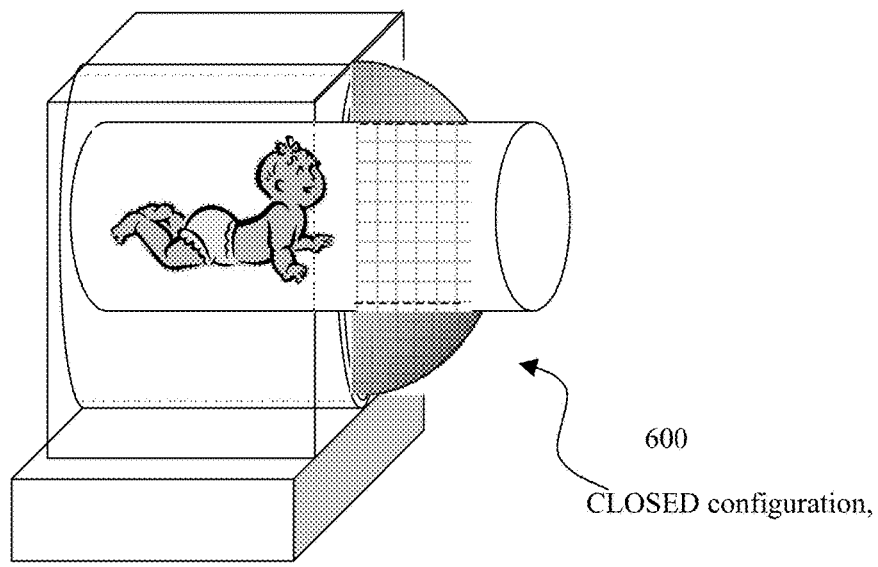
FIG. 6 illustrates a rotatable protective cover of an MRI having an opening comprising an incubator in its close configuration in an imaging procedure, in accordance with a preferred embodiment of the present invention; and, FIG. 7 illustrates rotatable protective cover structures and positions, in accordance with a preferred embodiment of the present invention.

Reference is now made to FIG. 6 which presents a rotatable protective cover of a MRI in its close configuration 600 whilst comprising an incubator with a subject such as a child, a baby or an infant.

The rotatable protective cover has a shape selected from the group consisting of: tubular, cone shaped, cup shaped, cylindrical, sleeve like, and hollow with a perimeter configured to match a patient entrance bore opening in of the MRI and an internal shape configured to match an object placed within. The rotatable protective cover may further have a structure protruding from the MRI patient entrance bore opening in order to cover and shield the exterior portion of an incubator. The rotatable protective cover may further be applied upon the incubator in a wearable manner. The rotatable protective cover edge may further have a planner structure as illustrated in FIGS. 5 and 6.

Figure 7:
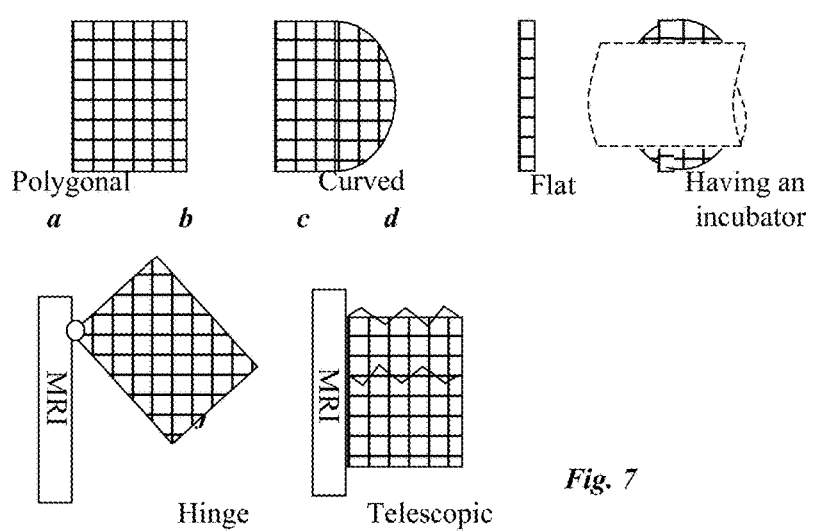

Reference is now made to FIG. 7 which illustrates a variety of structures which the rotatable protective cover may have and be positioned. The rotatable protective cover may have a curved structure (a), a polygonal structure (b), or may have a flat structure (c). Furthermore the rotatable protective cover may have a structure protruding from the exterior of the MRI patient entrance bore opening in order to contain the protruding portion of the incubator (d).

The rotatable protective cover may further be hingably mounted (e), to at least one side thereof, to a portion of the MRI opening tunnel, corresponding to one side of the opening by a hinge mechanism. The rotatable protective cover may further be extracted from the MRI. The rotatable protective cover may further positioned in a telescopic structure (f).

The invention claimed is:

1. A rotatable protective cover functioning as a door, that both opens and closes off, an entrance opening of a patient bore in a Magnetic Resonance Imaging (MRI) device, said rotatable protective cover comprising:
   a connector hinge coupled to the protective cover, that couples the protective cover onto the MRI device in a rotatable manner, such that when a patient is positioned within the patient bore of the MRI device, the protective cover is rotatable with the connector hinge so that the entrance opening of the MRI device patient bore may be either covered or uncovered; and
   the rotatable protective cover being a semi-permeable barrier constructed from a material that is at least partially transparent and provides both magnetic shielding and radio frequency shielding when the rotatable protective cover is positioned in order to completely cover the entrance opening of the bore.

2. The rotatable protective cover according to claim 1, wherein said semi-permeable barrier material is made at least partially of connected strands of flexible or ductile material.

3. The rotatable protective cover according to claim 2, wherein said connected strands of flexible or ductile material comprises a material selected from the group consisting of metal and fiber.

4. The rotatable protective cover according to claim 1, wherein said semi-permeable barrier is constructed of a material selected from the group consisting of copper, paramagnetic materials, ferromagnetic materials, and any combination thereof.

5. The rotatable protective cover according to claim 1, wherein said semi-permeable barrier has a structure of either a mesh, a web or a net.

6. The rotatable protective cover according to claim 1, wherein said rotatable protective cover is transparent.

7. The rotatable protective cover according to claim 1, wherein said rotatable protective cover further comprises a ring frame that is disposed around the perimeter of said rotatable protective cover.

8. The rotatable protective cover according to claim 1, wherein when said rotatable protective cover is in a closed position, the entrance opening of said MRI device is completely covered by said rotatable protective cover.

9. The rotatable protective cover according to claim 1, wherein said magnetic shielding extends over an area that is at least equal to an open area of said patient bore entrance opening of the MRI device.

10. The rotatable protective cover according to claim 1, wherein said connector hinge is configured such that upon opening, said rotatable protective cover remains attached to said patient bore entrance opening of the MRI device.

11. The rotatable protective cover according to claim 1, wherein said rotatable protective cover has a shape selected from the group consisting of:

tubular, cone shaped, cup shaped, cylindrical, sleeve-like, or any combination thereof, and the rotatable protective cover is hollow while having a perimeter that is configured to match the bore of said MRI device and an internal shape configured to match an object placed within the bore of the MRI device.

12. The rotatable protective cover according to claim 1, wherein said rotatable protective cover has a shape which can be mated to an incubator, when an incubator is desired to be positioned within said MRI device.

* * * * *